United States Patent
Kikutani et al.

(10) Patent No.: US 9,373,523 B2
(45) Date of Patent: Jun. 21, 2016

(54) SEMICONDUCTOR DEVICE MANUFACTURING METHOD

(71) Applicant: KABUSHIKI KAISHA TOSHIBA, Minato-ku (JP)

(72) Inventors: Keisuke Kikutani, Yokkaichi (JP); Tsubasa Imamura, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/616,847

(22) Filed: Feb. 9, 2015

(65) Prior Publication Data
US 2016/0071739 A1    Mar. 10, 2016

Related U.S. Application Data

(60) Provisional application No. 62/048,490, filed on Sep. 10, 2014.

(51) Int. Cl.
*H01L 21/311* (2006.01)
*H01L 21/3065* (2006.01)

(52) U.S. Cl.
CPC ...... *H01L 21/31122* (2013.01); *H01L 21/3065* (2013.01)

(58) Field of Classification Search
CPC ............... H01L 21/3065; H01L 21/31122; C23F 1/00
See application file for complete search history.

(56) References Cited

U.S. PATENT DOCUMENTS 5,393,375 A * 2/1995 MacDonald ........ B81C 1/00531
148/DIG. 135
6,420,095 B1 * 7/2002 Kawamura .............. G03F 7/091
216/58

FOREIGN PATENT DOCUMENTS

JP    2000-150477    5/2000
JP    3410249        5/2003
JP    2012-169390    9/2012

* cited by examiner

*Primary Examiner* — Duy Deo
(74) *Attorney, Agent, or Firm* — Oblon, McClelland, Maier & Neustadt, L.L.P (57) ABSTRACT

A semiconductor device manufacturing method includes performing reactive ion etching of the film containing a metal disposed on the bottom of the first groove and the film containing a metal disposed on the bottom of the second groove under a same condition in a state where the substrate is heated to the target temperature.

10 Claims, 8 Drawing Sheets

SEMICONDUCTOR DEVICE MANUFACTURING METHOD

CROSS-REFERENCE TO RELATED APPLICATION

This application is based upon and claims the benefit of U.S. provisional Application No. 62/048,490, filed on Sep. 10, 2014, the entire contents of which are incorporated herein by reference.

BACKGROUND

1. Field

Embodiments described herein relate generally to a semiconductor device manufacturing method.

2. Background Art

In a semiconductor device manufacturing process, a substrate is etched with a pattern by dry etching, such as reactive ion etching (RIE). To achieve higher processing speed and higher degree of integration of the semiconductor device, rapid advances are being made in fine patterning, and micromachining in a groove (space pattern) having a small opening width (space width) is needed.

The etching rate of reactive ion etching decreases at the bottom of the groove having such a small opening width. In particular, a metal compound film of an aluminum-based metal or the like, which has a low vapor pressure, is difficult to process, and the etching rate of reactive ion etching of such a film is markedly low.

Therefore, a micro-loading phenomenon can occur in which the etching rate differs between the metal compound film disposed on the bottom of a groove having a large opening width and the metal compound film disposed on the bottom of a groove having a small opening width.

DETAILED DESCRIPTION

A semiconductor device manufacturing method according to an embodiment includes heating a substrate to a target temperature at which the difference between a first etching rate and a second etching rate falls within a predetermined range, the first etching rate being an etching rate of reactive ion etching of a film containing a metal disposed on a bottom of a first groove that has an opening width smaller than a prescribed value, the first groove being formed on the substrate and having the film on an inner surface thereof, and the second etching rate is an etching rate of reactive ion etching of the film disposed on a bottom of a second groove that has an opening width equal to or greater than the prescribed value, the second groove being formed on the substrate and having the film on an inner surface thereof. The semiconductor device manufacturing method includes performing reactive ion etching of the film disposed on the bottom of the first groove and the film disposed on the bottom of the second groove under a same process in a state where the substrate is heated to the target temperature.

DETAILED DESCRIPTION OF THE INVENTION

In the following, embodiments will be described with reference to the drawings. The embodiments described below are given for illustrative purposes only and do not limit the present invention in any way.

First Embodiment

Figure 1:
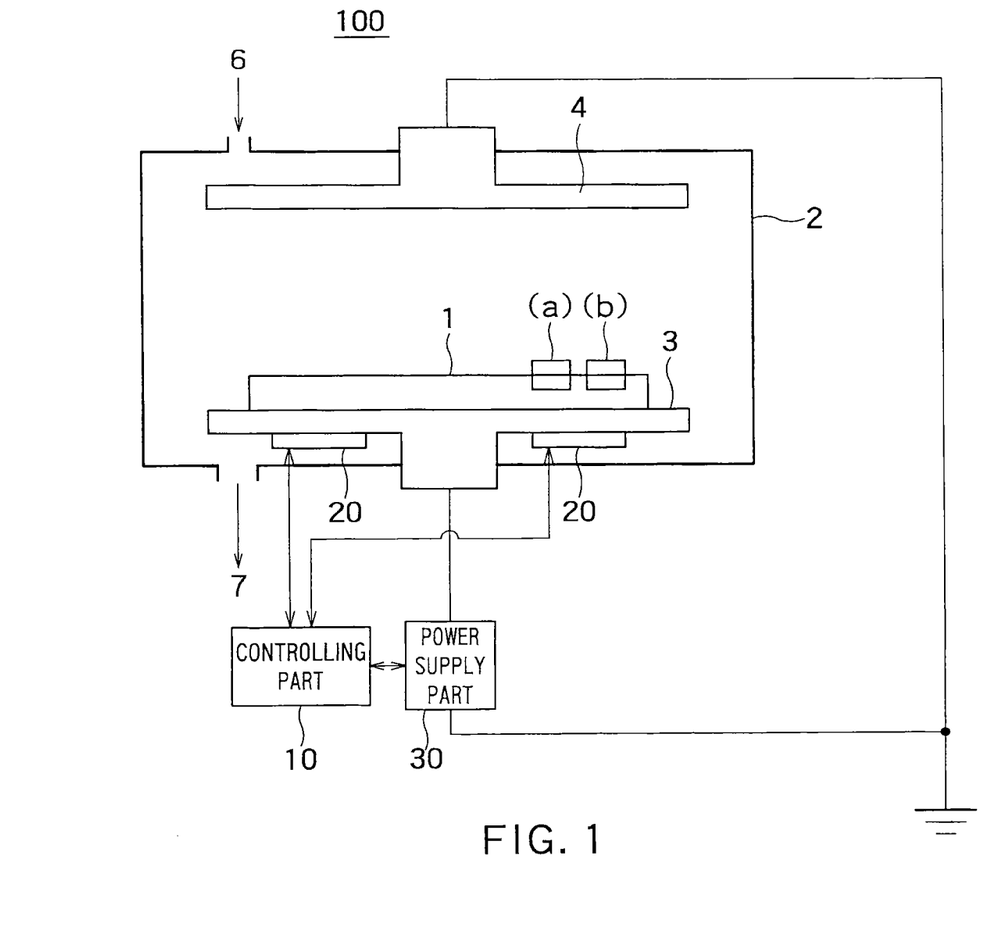
FIG. 1 is a schematic diagram showing an example of a configuration of a semiconductor device manufacturing apparatus 100 to which the first embodiment is applied.

First, a semiconductor device manufacturing apparatus to which a first embodiment is applied will be described. FIG. 1 is a schematic diagram showing an example of a configuration of a semiconductor device manufacturing apparatus 100 to which the first embodiment is applied.

As shown in FIG. 1, the semiconductor device manufacturing apparatus 100 that performs reactive ion etching of a substrate 1 includes a chamber 2, a lower electrode 3, an upper electrode 4, a controlling part 10, a heating part 20, and a power supply part 30, for example.

The controlling part 10 sets a target temperature and controls the heating part 20 and the power supply part 30.

The heating part 20 heats the lower electrode 3 to the set target temperature, thereby heating the substrate 1 to be processed mounted on the lower electrode 3 in the chamber 2 to the target temperature set by the controlling part 10. An etching gas is introduced into the chamber 2 through an opening 6 and discharged from the chamber 2 through an opening 7.

The power supply part 30 supplies a high-frequency voltage to the lower electrode 3 to convert the etching gas into plasma between the upper electrode 4 and the lower electrode 3. Ions in the plasma etch a metal compound film (a film containing a metal) formed on the substrate 1 heated to the target temperature.

As described above, the semiconductor device manufacturing apparatus 100 heats the substrate 1 mounted on the lower electrode 3 to the target temperature and performs reactive ion etching of the substrate 1.

Figure 2:
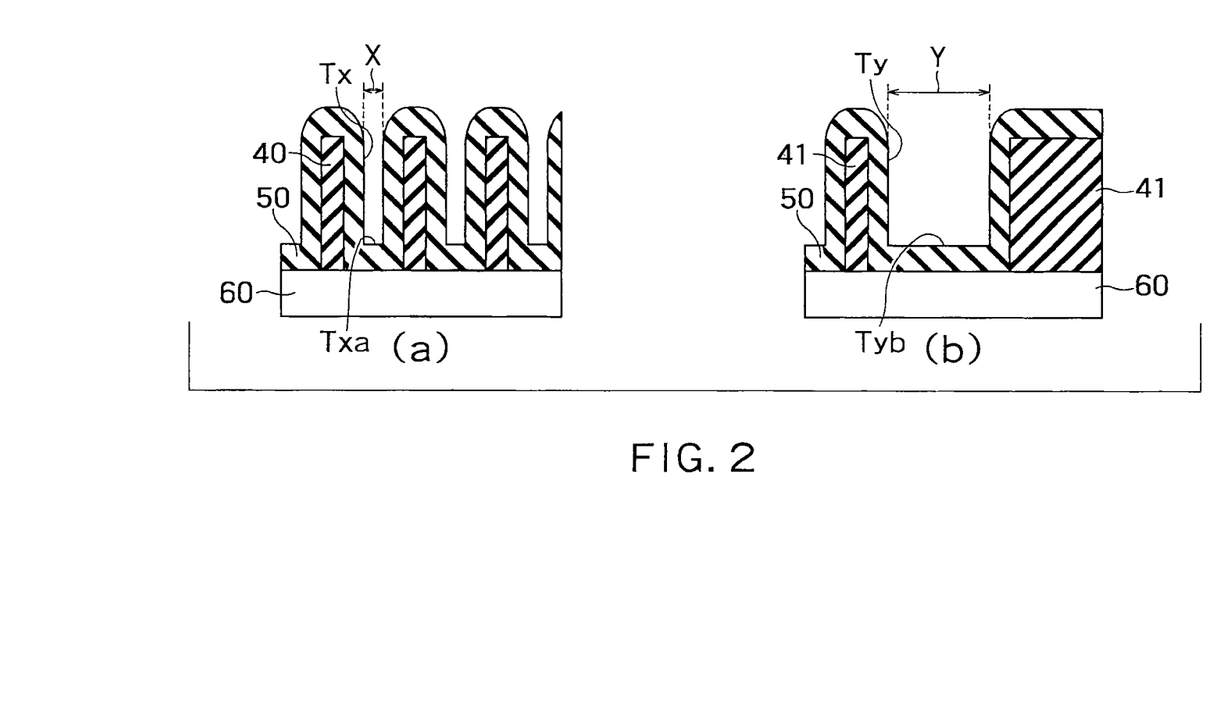
FIG. 2 are schematic diagrams showing examples of cross sections of regions (a) and (b) of the substrate 1 disposed in the semiconductor device manufacturing apparatus 100 shown in FIG. 1.

Next, a structure of the substrate 1 to which the semiconductor device manufacturing method according to this embodiment is applied will be described. FIG. 2 are schematic diagrams showing examples of cross sections of regions (a) and (b) of the substrate 1 disposed in the semiconductor device manufacturing apparatus 100 shown in FIG. 1. FIG. 2(*a*) shows the region (a) of the substrate 1 in FIG. 1. FIG. 2(*b*) shows the region (b) of the substrate 1 in FIG. 1.

As shown in FIGS. 2(*a*) and 2(*b*), the substrate 1 includes an amorphous silicon (aSi) film 60 and a plurality of core layers 40 and 41 of $SiO_2$, for example, formed on an upper surface of the amorphous silicon film 60. A metal compound film (an AlN film in this example) 50, which is one of films containing a metal, is deposited on surfaces of the core layers 40 and 41 and an upper surface of the amorphous silicon film 60. The metal compound film 50 is formed by atomic layer deposition (ALD), for example. The metal compound film 50 contains an Al-based material, such as AlON, AlN or $Al_2O_3$. The thickness of the metal compound film 50 is 20 nm, for example, at a bottom "Txa" of a first groove (a space pattern) "Tx" and a bottom "Tyb" of a second groove (a space pattern) "Ty".

As shown in FIG. 2(*a*), the surface of the metal compound film 50 deposited on the side walls of the core layers 40 and the surface of the metal compound film 50 deposited on the upper surface of the amorphous silicon film 60 form the first groove (space pattern) "Tx" that has an opening width (space width) "X" smaller than a prescribed value and has the metal compound film 50 on the inner surface thereof.

As shown in FIG. 2(*b*), the surface of the metal compound film 50 deposited on the side walls of the core layers 41 and the surface of the metal compound film 50 deposited on the upper surface of the amorphous silicon film 60 form the second groove (space pattern) "Ty" that has an opening width (space width) "Y" equal to or greater than the prescribed value and has the metal compound film 50 on the inner surface thereof.

That is, the metal compound film 50 is formed not only on the bottoms "Txa" and "Tyb" of the first groove "Tx" and the second groove "Ty" but also on the side surfaces of the first groove "Tx" and the second groove "Ty".

As described above, the first and second grooves "Tx" and "Ty" having different opening widths are formed on the same substrate 1, and the metal compound film 50 is deposited on the inner surfaces of the first and second grooves "Tx" and "Ty". The prescribed values described above are 20 nm, for example.

Figure 3:
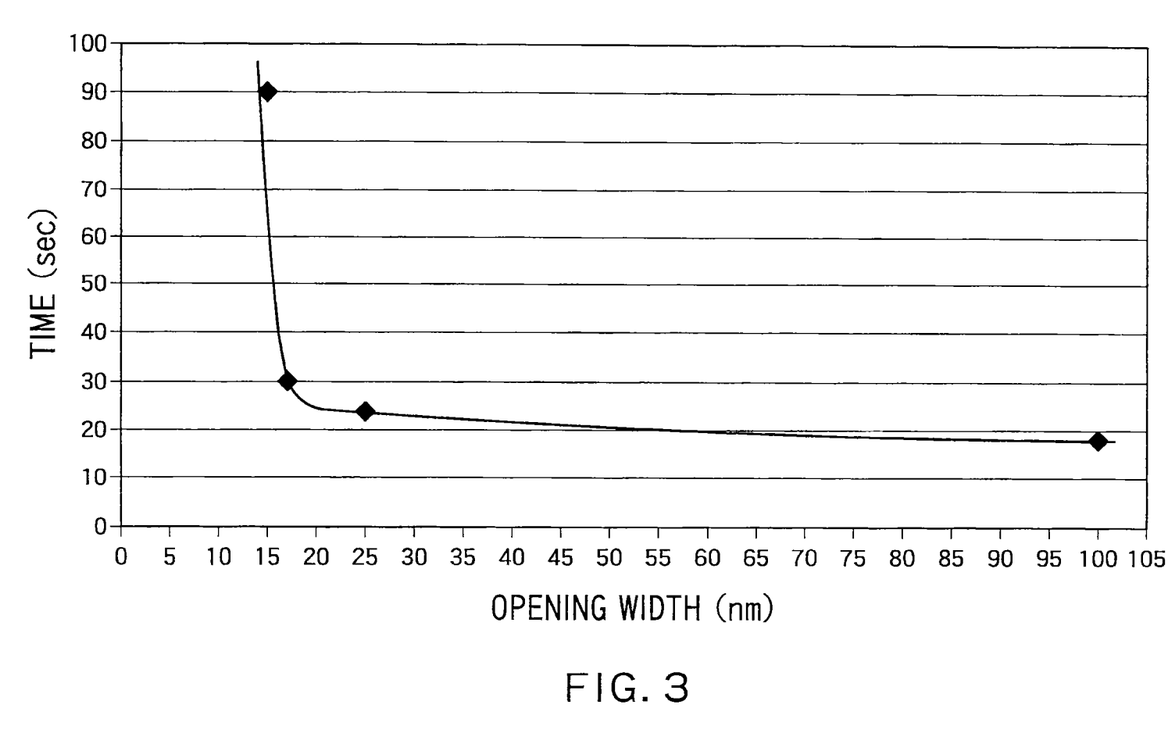
FIG. 3 is a characteristic diagram showing a relationship between the opening width of the groove in which the metal compound film is deposited and the time required to remove the metal compound film on the bottom of the groove by etching in the case where reactive ion etching is performed on the metal compound film on the bottom of the groove.

FIG. 3 is a characteristic diagram showing a relationship between the opening width of the groove in which the metal compound film is deposited and the time required to remove the metal compound film on the bottom of the groove by etching in the case where reactive ion etching is performed on the metal compound film on the bottom of the groove. In the example shown in FIG. 3, the metal compound film is an AlN film, and the thickness of the metal compound film is 20 nm. In this example, the temperature of the lower electrode (and the substrate) during reactive ion etching is 80° C.

As shown in FIG. 3, the time required to remove the AlN film on the bottom of the groove by reactive ion etching depends on the opening width of the groove. The processing time abruptly increases as the opening width becomes smaller than 20 nm.

Figure 4:
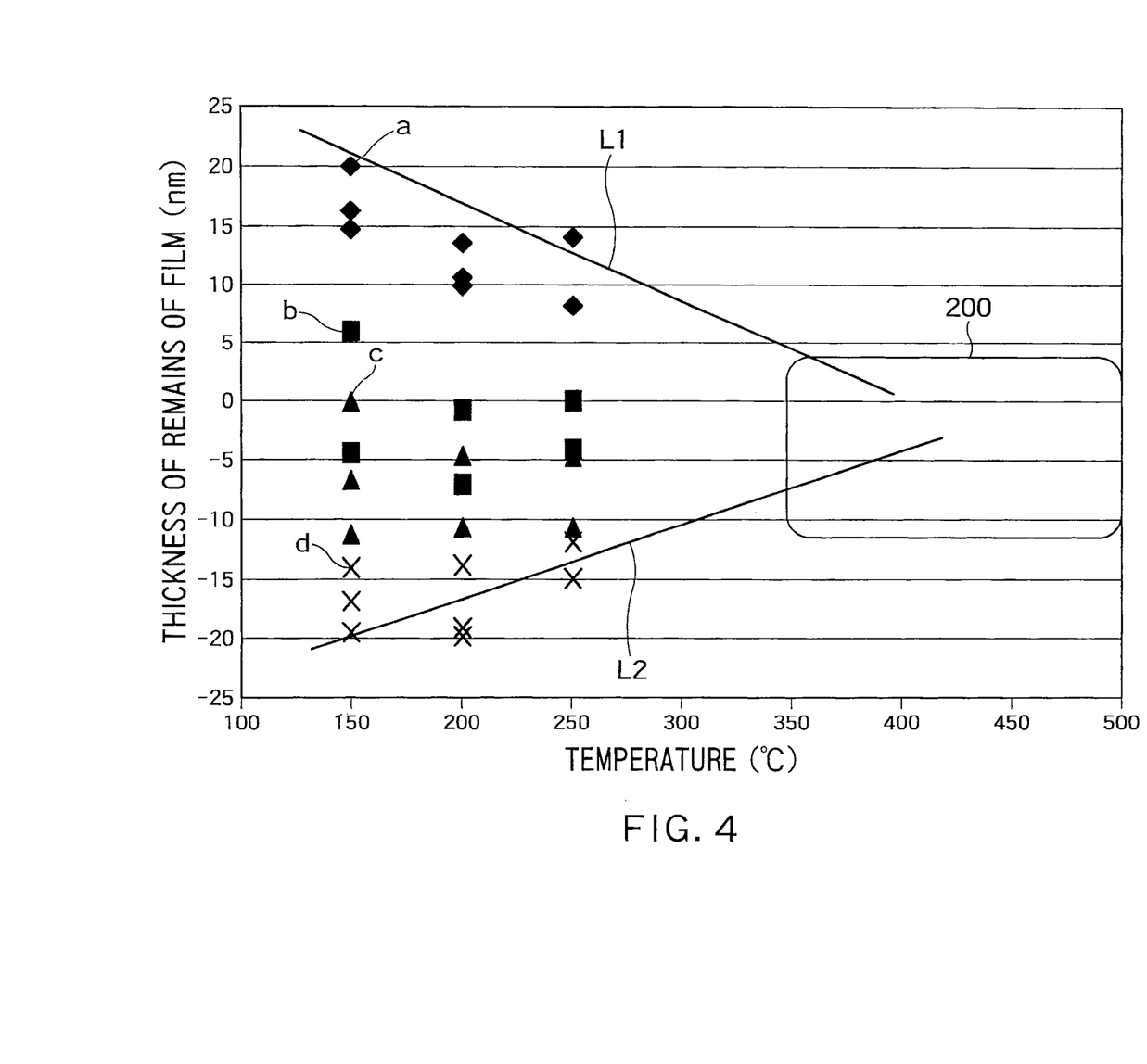
FIG. 4 is a characteristic diagram showing a relationship between the temperature of the lower electrode (and the substrate) in the chamber and the thickness of the remains of the metal compound film on the bottom of the groove in the case where reactive ion etching is performed on the metal compound film on the bottom of the groove.

FIG. 4 is a characteristic diagram showing a relationship between the temperature of the lower electrode (and the substrate) in the chamber and the thickness of the remains of the metal compound film on the bottom of the groove in the case where reactive ion etching is performed on the metal compound film on the bottom of the groove. In the example shown in FIG. 4, the metal compound film is an AlN film. In the example shown in FIG. 4, the processing time of the reactive ion etching is 10 sec. In FIG. 4, "a" indicates an actual value of a sample having an opening width of approximately 12 nm, "b" indicates an actual value of a sample having an opening width of approximately 20 nm, "c" indicates an actual value of a sample having an opening width of approximately 23 nm, and "d" indicates an actual value of a sample having an opening width of approximately 85 nm. In FIG. 4, the solid line "L1" is an approximate line of the actual values of the sample having an opening width of approximately 12 nm, and the solid line "L2" is an approximate line of the actual values of the sample having an opening width of approximately 85 nm.

As shown in FIG. 4, as the temperature of the lower electrode (and the substrate) in the chamber increases, the thickness of the remains of the film on the bottom of the groove having an opening width of approximately 12 nm decreases (that is, the etching rate increases), while the thickness of the remains of the film on the bottom of the groove having an opening width of approximately 23 nm and the thickness of the remains of the film on the bottom of the groove having an opening width of approximately 85 nm increase (that is, the etching rate decreases).

In this way, when the temperature of the lower electrode (and the substrate) in the chamber increases, the etching rate varies differently depending on whether or not the opening width of the groove is approximately greater than 20 nm.

Figure 5:
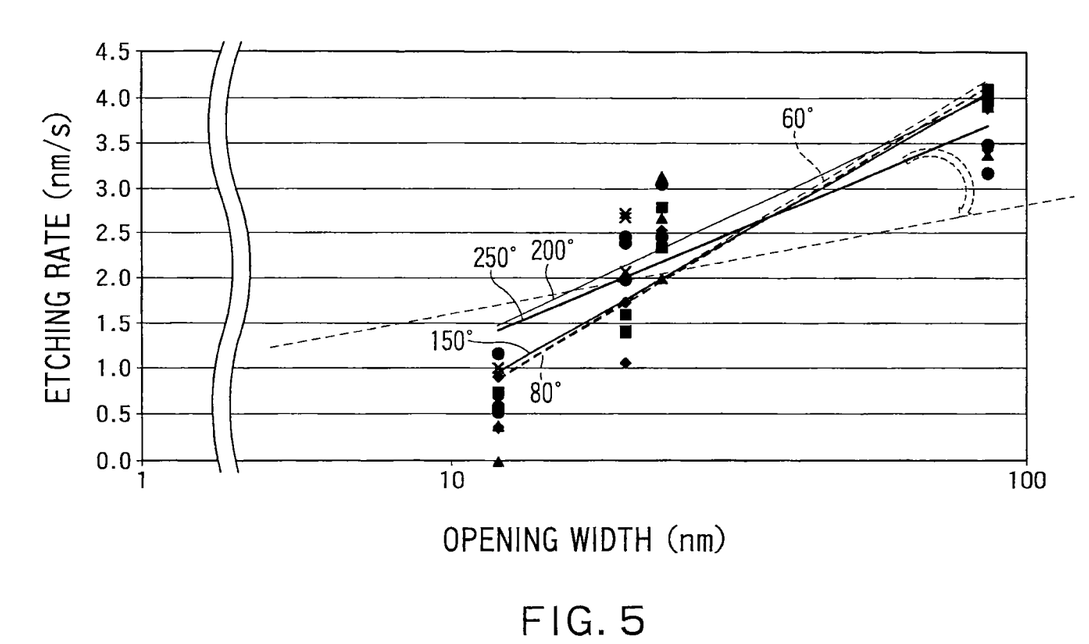
FIG. 5 is a characteristic diagram showing an example of a relationship between the etching rate and the opening width of the groove in the case where the temperature of the lower electrode (and the substrate) in the chamber is changed.

FIG. 5 is a characteristic diagram showing an example of a relationship between the etching rate and the opening width of the groove in the case where the temperature of the lower electrode (and the substrate) in the chamber is changed. In the example shown in FIG. 5, the metal compound film is an AlN film. In the example shown in FIG. 5, the temperature of the lower electrode (and the substrate) in the chamber is changed to 60° C., 80° C., 150° C., 200° C., and 250° C. In FIG. 5, approximate lines of actual values of the etching rate at the temperatures are also shown.

As shown in FIG. 5, the slope of the approximate line tends to be gentle as the temperature of the lower electrode (and the substrate) in the chamber increases. In other words, it can be considered that, as the temperature of the lower electrode (and the substrate) in the chamber increases from 60° C., the difference between the etching rate of the metal compound film on the bottom of the groove having an opening width smaller than 20 nm and the etching rate of the metal compound film on the bottom of the groove having an opening width equal to or greater than 20 nm decreases.

Thus, it can be contemplated that the target temperature of the substrate in the reactive ion etching is set based on the characteristic that the etching rate of the metal compound film on the bottom of the groove having an opening width smaller than 20 nm increases as the temperature of the substrate increases and on the characteristic that the etching rate of the metal compound film on the bottom of the groove having an opening width equal to or greater than 20 nm decreases as the temperature of the substrate increases.

Figure 6:
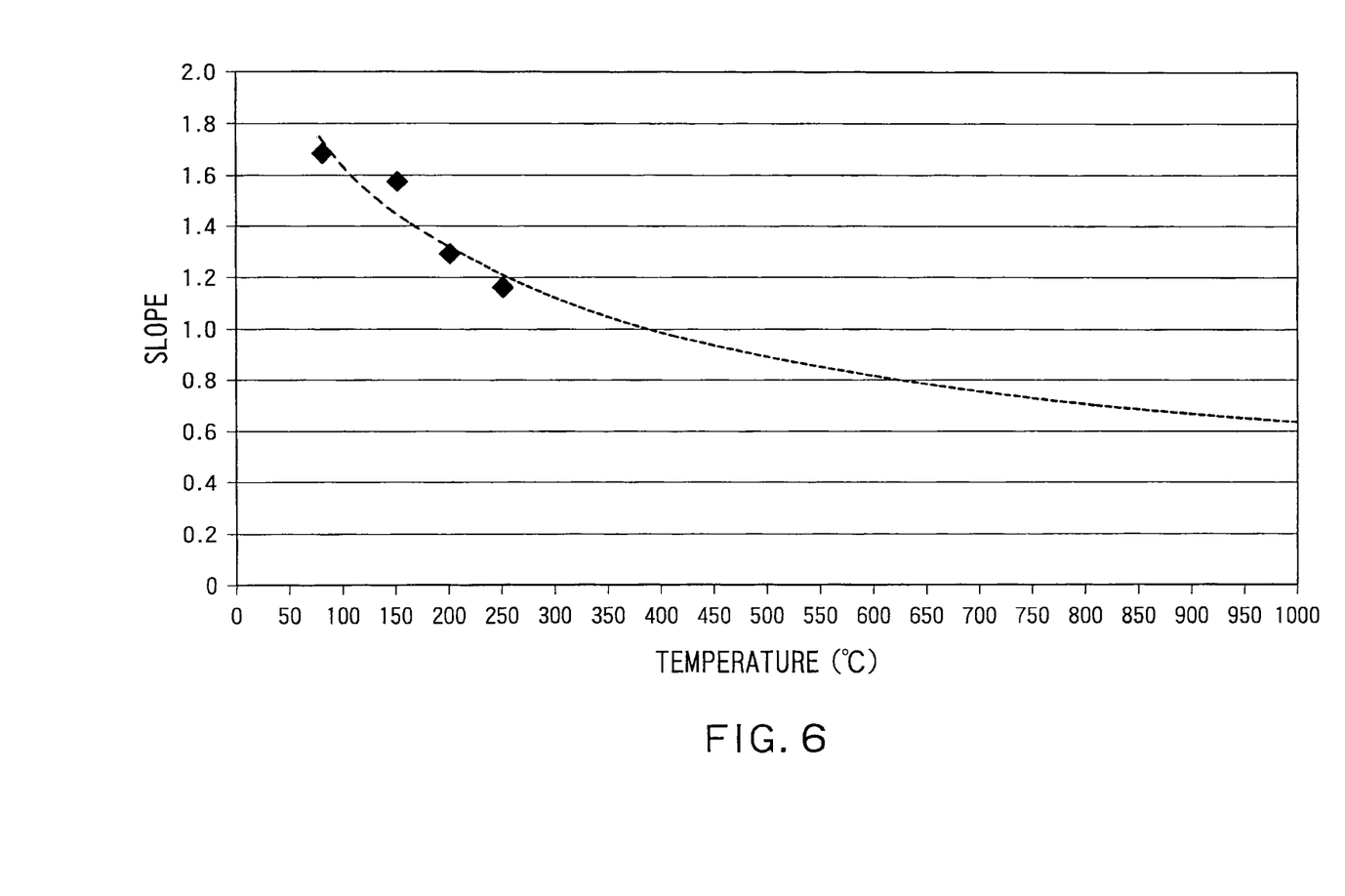
FIG. 6 is a characteristic diagram showing an example of a relationship between the slope of the approximate lines shown in FIG. 5 and the temperature of the lower electrode (and the substrate) in the chamber.

FIG. 6 is a characteristic diagram showing an example of a relationship between the slope of the approximate lines shown in FIG. 5 and the temperature of the lower electrode (and the substrate) in the chamber.

In FIG. 6, the dashed line shows a prediction of how the slope of the approximate line varies as the temperature of the lower electrode (and the substrate) in the chamber varies within a range from 250° C. to 1000° C. As shown in FIG. 6, in the range from 250° C. to 1000° C., it is predicted that the slope of the approximate line tends to be gentle as the temperature of the substrate increases.

Furthermore, from the slope of the approximate line shown in FIG. 6, the difference in etching rate between the groove having an opening width of 85 nm and the groove having an opening width of 12 nm can be calculated. From the calculated difference in etching rate, it can be seen that the temperature of the substrate 1 needs to be higher than approximately 350° C. in order for the etching rate to be lower than 2.0 (nm/s), for example. In addition, since the melting point of the Al material is preferably lower than 660° C., the upper limit of the temperature of the substrate 1 is preferably 600° C., for example. As described above, the etching rate of the reactive ion etching of the Al-based compound on the bottom of the groove having an opening width smaller than 20 nm is markedly low. However, it can be considered that, if the temperature of the substrate 1 falls within the range from 350° C. to 600° C., the reduction of the etching rate can be minimized (this range is shown as a temperature range 200 in FIG. 4).

From the above discussion, it is considered that the difference in etching rate between the metal compound films on the bottoms of the grooves having different opening widths can be reduced by heating the substrate.

Figure 7:
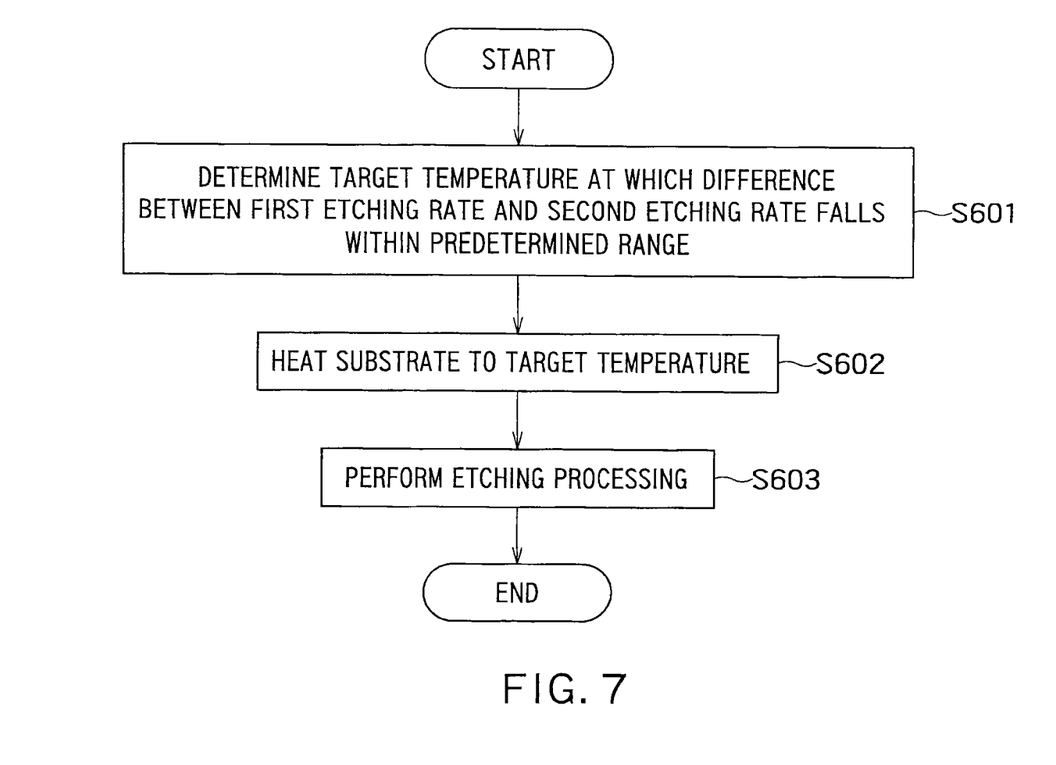
FIG. 7 is a flowchart showing an example of the semiconductor device manufacturing method that uses the semiconductor device manufacturing apparatus 100 shown in FIG. 1.

Next, an example of the semiconductor device manufacturing method according to this embodiment based on the above discussion will be described. FIG. 7 is a flowchart showing an example of the semiconductor device manufacturing method that uses the semiconductor device manufacturing apparatus 100 shown in FIG. 1.

First, the controlling part 10 determines the target temperature at which the difference between a first etching rate of reactive ion etching of the metal compound film 50 on the bottom "Txa" of the first groove "Tx" having the opening width "X" smaller than a prescribed value formed on the substrate 1 and a second etching rate of reactive ion etching of the metal compound film 50 on the bottom "Tyb" of the second groove "Ty" having the opening width "Y" equal to or greater than the prescribed value formed on the substrate 1 falls within a predetermined range (2.0 (nm/s), for example) (Step S601).

As described above, the prescribed value is 20 nm, for example. And as described above, the metal compound film is an aluminum-based metal compound film containing any one of AlON, AlN and $Al_2O_3$, for example. In this case, the etching gas used for the reactive ion etching is a chlorine-based gas containing any one of $Cl_2$ and $BCl_3$, for example.

When the metal compound film is an aluminum-based metal compound film, the target temperature is set to be equal to or higher than 350° C. and lower than 600° C., for example.

The controlling part 10 then controls the heating part 20 to heat the lower electrode in the changer to the set target temperature. As a result, the substrate 1 is also heated to the target temperature (Step S602).

In the state where the substrate 1 is heated to the target temperature, the controlling part 10 then controls the power supply part 30 to perform reactive ion etching of the metal compound film on the bottom "Txa" of the first groove "Tx" and the metal compound film on the bottom "Tyb" of the second groove "Ty" (at the same time) (Step S603). That is to say, the reactive ion etching of the metal compound film on the bottom "Txa" of the first groove "Tx" and the reactive ion etching of the metal compound film on the bottom "Tyb" of the second groove "Ty" are a same process (processed under a same condition in the state).

As described above, in the reactive ion etching, the substrate 1 is heated to the target temperature, thereby increasing the etching rate of the metal compound film 50 on the bottom "Txa" of the groove "Tx" having the opening width "X" smaller than the prescribed value (20 nm) and decreasing the etching rate of the metal compound film 50 on the bottom "Tyb" of the groove "Ty" having the opening width "Y" equal to or greater than the prescribed value.

As a result, the difference between the etching rate of the metal compound film 50 on the bottom "Txa" of the groove "Tx" having the opening width "X" smaller than the prescribed value and the etching rate of the metal compound film on the bottom "Tyb" of the groove "Ty" having the opening width "Y" equal to or greater than the prescribed value can be made to fall within a predetermined range.

As described above, according to the semiconductor device manufacturing method according to this embodiment, the difference in etching rate between the metal compound films on the bottoms of the grooves having different opening widths can be reduced by heating the lower electrode (and the substrate) in the chamber. That is, a micro-loading phenomenon can be suppressed.

Second Embodiment

In the first embodiment described above, an example in which reactive ion etching is performed on a substrate on which a metal compound film is deposited not only on the bottom of a groove but also on the side surfaces of the groove has been described. However, the present invention can achieve the same advantages even in the case where reactive ion etching is performed on a substrate on which a metal compound film is deposited only on the bottom of a groove.

In a second embodiment, an example in which reactive ion etching is performed on a substrate on which a metal compound film is deposited only on the bottom of a groove will be described.

Figure 8:
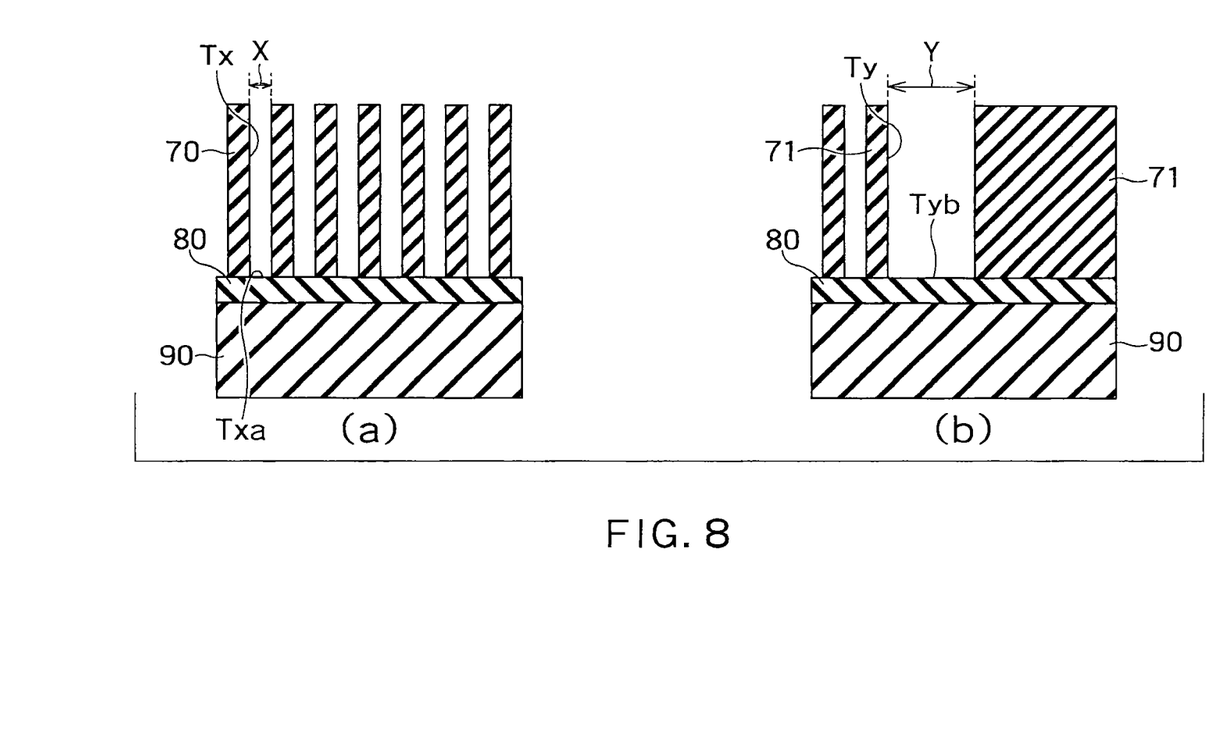
FIG. 8 are schematic diagrams showing other examples of the cross sections of the regions (a) and (b) of the substrate 1 disposed in the semiconductor device manufacturing apparatus 100 shown in FIG. 1.

FIG. 8 are schematic diagrams showing other examples of the cross sections of the regions (a) and (b) of the substrate 1 disposed in the semiconductor device manufacturing apparatus 100 shown in FIG. 1. FIG. 8(a) shows the region (a) of the substrate 1 in FIG. 1. FIG. 8(b) shows the region (b) of the substrate 1 in FIG. 1. In FIG. 8, the same reference numerals as those shown in FIG. 2 denote the same components as those in the first embodiment.

As shown in FIGS. 8(a) and 8(b), the substrate 1 includes a metal compound film 80 on a $SiO_2$ film 90. The metal compound film 80 is formed to a thickness of 20 nm by ALD, for example. That is, the thickness of the metal compound film 80 at the bottom "Txa" of the first groove "Tx" and at the bottom "Tyb" of the second groove "Ty" is 20 nm, for example. The metal compound film 80 contains an aluminum-based material, such as AlON, AlN and $Al_2O_3$.

As shown in FIGS. 8(a) and 8(b), SiN (silicon nitride) layers 70 and 71 are formed on the metal compound film 80 in a line and space pattern. The SiN layers 70 and 71 serve as hard masks in reactive ion etching. That is, in this case, the side walls of the first groove "Tx" and the second groove "Ty" are hard masks.

As shown in FIG. 8(a), the side surfaces of the SiN layers 70 and the upper surface of the metal compound film 80 form the first groove "Tx" having the opening width "X" smaller than a prescribed value. As shown in FIG. 8(b), the side surfaces of the SiN layers 71 and the upper surface of the metal compound film 80 form the second groove "Ty" having the opening width "Y" equal to or greater than the prescribed value.

As described above, the first and second grooves "Tx" and "Ty" having different opening widths are formed on the same substrate 1, and the metal compound film 80 is deposited on the bottoms of the first and second grooves "Tx" and "Ty". The prescribed value is 20 nm, for example.

If the semiconductor device manufacturing apparatus 100 performs reactive ion etching on the substrate 1 configured as described above under the consistent condition (at a time), the SiN layers 70 and 71, which are hard masks, serve as masks in the reactive ion etching of the metal compound film 80. In other respects, the second embodiment is the same as the first embodiment.

That is, in this embodiment, again, in the reactive ion etching, the substrate 1 is heated to the target temperature, thereby increasing the etching rate of the metal compound film 80 on the bottom "Txa" of the groove "Tx" having the opening width "X" smaller than the prescribed value (20 nm) and decreasing the etching rate of the metal compound film 80 on the bottom "Tyb" of the groove "Ty" having the opening width "Y" equal to or greater than the prescribed value.

As a result, the difference between the etching rate of the metal compound film 80 on the bottom "Txa" of the groove "Tx" having the opening width "X" smaller than the prescribed value and the etching rate of the metal compound film 80 on the bottom "Tyb" of the groove "Ty" having the opening width "Y" equal to or greater than the prescribed value can be made to fall within a predetermined range.

That is, as with the semiconductor device manufacturing method according to the first embodiment, according to the semiconductor device manufacturing method according to this embodiment, the difference in etching rate between the metal compound films on the bottoms of the grooves having different opening widths can be reduced by heating the lower electrode (and the substrate) in the chamber. That is, a microloading phenomenon can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising; heating a substrate to a target temperature at which the difference between a first etching rate and a second etching rate falls within a target range, the first etching rate being an etching rate of reactive on etching of a film containing a meta disposed on a bottom of a first groove that has an opening width smaller than a prescribed value, the first groove being formed on the substrate and having the film on an inner surface thereof, and the second etching rate is an etching rate of reactive on etching of the film disposed on a bottom of a second groove that has an opening width equal to or greater than the prescribed value, the second groove being formed on the substrate and having the film on an inner surface thereof; and performing reactive on etching of the film disposed on the bottom of the first groove and the film disposed on the bottom of the second groove at a same time under a same process in a state where the substrate is heated to the target temperature, wherein the prescribed value is 20 nm, wherein the target temperature is set based on a characteristic that the first etching rate increases as the temperature of the substrate increases and a characteristic that the second etching rate decreases as the temperature of the substrate increases, and wherein the film is an aluminum-based film containing any one of AlON, AlN and $Al_2O_3$.

2. The semiconductor device manufacturing method according to claim 1, wherein an etching gas used for the reactive on etching is a chlorine-based gas containing any one of $Cl_2$ and $BC_3$.

3. The semiconductor device manufacturing method according to claim 2, wherein the target temperature is equal to or higher than 350° C. and lower than 600° C.

4. The semiconductor device manufacturing method according to claim 1, wherein the target temperature is equal to or higher than 350° C. and lower than 600° C.

5. The semiconductor device manufacturing method according to claim 1, wherein the target range is 2.0 nm/s.

6. A semiconductor device manufacturing method, comprising:

heating a substrate having a film to a target temperature, a first groove being formed on the substrate and having an opening width smaller than 20 nm, the first groove having the film on an inner surface thereof, the film disposed on a bottom of the first groove, a second groove being formed on the substrate and having an opening width equal to or greater than 20 nm, the second groove having the film on an inner surface thereof, and the film disposed on a bottom of the second groove; and performing reactive ion etching of the film disposed on the bottom of the first groove and the film disposed on the bottom of the second groove at a same time under a same process in a state where the substrate is heated to the target temperature, wherein an etching gas used for the reactive ion etching is a chlorine-based gas containing any one of $Cl_2$ and $BCl_3$, wherein the target temperature is equal to or higher than 350° C. and lower than 600° C., wherein the film is an aluminum-based film containing any one of AlON, AlN, and $Al_2O_3$, and wherein the target temperature is set based on a characteristic that a first etching rate increases as the temperature of the substrate increases and a characteristic that a second etching rate decreases as the temperature of the substrate increases.

7. A semiconductor device manufacturing method, comprising:

heating a substrate to a target temperature at which the difference between a first etching rate and a second etching rate falls within a target range, the first etching rate being an etching rate of reactive on etching of a film containing a metal disposed on a bottom of a first groove that has an opening width smaller than a prescribed value, the first groove being formed on the substrate and having the film on an inner surface thereof, and the second etching rate is an etching rate of reactive on etching of the film disposed on a bottom of a second groove that has an opening width equal to or greater than the prescribed value, the second groove being formed on the substrate and having the film on an inner surface thereof; and performing reactive on etching of the film disposed on the bottom of the first groove and the film disposed on the bottom of the second groove at a same time under a same process in a state where the substrate is heated to the target temperature, wherein the prescribed value is 20 nm, wherein an etching gas used for the reactive ion etching is a chlorine-based gas containing any one of $Cl_2$ and $BCl_3$, wherein the film is an aluminum-based film containing any one of AlON, AlN, and $Al_2O_3$, and wherein the target temperature is set based on a characteristic that the first etching rate increases as the temperature of the substrate increases and a characteristic that the second etching rate decreases as the temperature of the substrate increases.

8. The semiconductor device manufacturing method according to claim 7, wherein the target temperature is equal to or higher than 350° C. and lower than 600° C.

9. The semiconductor device manufacturing method according to claim 7, wherein the target range is 2.0 nm/s.

10. The semiconductor device manufacturing method according to claim 7, wherein the target range is 2.0 nm/s.

* * * * *